US008755532B2

(12) United States Patent
Lee et al.

(10) Patent No.: US 8,755,532 B2
(45) **Date of Patent: *Jun. 17, 2014**

(54) NETWORK AUDIO PROCESSOR

(75) Inventors: Bret Evan Lee, Oakland, CA (US); Ken Harris, Alameda, CA (US)

(73) Assignee: Thomson Licensing, Boulogne-Billancourt (FR)

( * ) Notice: Subject to any disclaimer, the term of this patent is extended or adjusted under 35 U.S.C. 154(b) by 408 days.

This patent is subject to a terminal disclaimer.

(21) Appl. No.: 12/733,214

(22) PCT Filed: Jul. 17, 2008

(86) PCT No.: PCT/US2008/008735

§ 371 (c)(1), (2), (4) Date: Feb. 16, 2010

(87) PCT Pub. No.: WO2009/025705

PCT Pub. Date: Feb. 26, 2009

(65) Prior Publication Data

US 2010/0142716 A1 Jun. 10, 2010

Related U.S. Application Data

(60) Provisional application No. 60/964,978, filed on Aug. 16, 2007.

(51) Int. Cl.

*H03G 3/20* (2006.01)
*H03G 3/00* (2006.01)
*H03G 5/00* (2006.01)

(52) U.S. Cl.

USPC ................ 381/57; 381/98; 381/104; 381/107

(58) Field of Classification Search

CPC ........... H03G 3/32; H03G 3/24; H03G 9/005; H03G 9/025; H03G 3/14; H03G 3/001; H03G 3/002; H03G 3/00; H03G 1/0088; H03G 3/3005

USPC ............... 381/56–59, 104, 107, 108, 98, 103, 381/120, 77, 81; 700/94

See application file for complete search history.

(56) References Cited

U.S. PATENT DOCUMENTS 2,564,437 A 8/1951 Kannenberg et al.
5,406,634 A 4/1995 Anderson et al.

(Continued)

FOREIGN PATENT DOCUMENTS

EP 0886456 12/1998
JP 57099047 6/1982

(Continued)

OTHER PUBLICATIONS

Goohyun et al. Block-basedfacedetection scheme using face color and motion information XP007905596 (Jan. 1, 2004).

(Continued)

*Primary Examiner* — Vivian Chin
*Assistant Examiner* — David Ton
(74) *Attorney, Agent, or Firm* — Robert D. Shedd; Jorge Tony Villabon

(57) ABSTRACT

An audio circuit and associated method for enhanced intelligibility of audio content includes a first means for receiving reproduced audio content, a microphone for providing a microphone output signal in accordance with ambient noise, a second means for enabling the microphone output signal when the reproduced audio content is off, and disabling the microphone output signal when the reproduced audio content is on, and a signal processor, in communication with the first and second means. The signal processor applies a transfer function to the reproduced audio content for increasing gain to the reproduced audio content as a function of increasing amplitude of the microphone output signal, and decreasing gain to the reproduced audio content signal as a function of decreasing amplitude of the microphone output signal, and applies an equalization curve to the audio content to boost frequencies in a range that enhances consonant perception thus increasing speech intelligibility.

10 Claims, 3 Drawing Sheets

(56) References Cited

U.S. PATENT DOCUMENTS

| | | | | |
|---|---|---|---|---|
| 5,450,624 | A | 9/1995 | Porambo et al. | |
| 5,790,671 | A * | 8/1998 | Cooper | 381/57 |
| 5,896,450 | A * | 4/1999 | Kurihara | 379/388.03 |
| 5,940,518 | A * | 8/1999 | Augustyn et al. | 381/59 |
| 6,385,322 | B1 | 5/2002 | Mietling | |
| 6,546,105 | B1 * | 4/2003 | Katayama et al. | 381/17 |
| 7,561,935 | B2 * | 7/2009 | Chung | 700/94 |
| 7,574,010 | B2 * | 8/2009 | Forrester et al. | 381/104 |
| 7,711,244 | B2 * | 5/2010 | Sato et al. | 386/201 |
| 7,890,284 | B2 * | 2/2011 | Patterson et al. | 702/117 |
| 7,970,153 | B2 | 6/2011 | Konagai et al. | |
| 8,218,784 | B2 * | 7/2012 | Schulein et al. | 381/74 |
| 2001/0003846 | A1 | 6/2001 | Rowe et al. | |
| 2003/0123680 | A1 * | 7/2003 | Lee et al. | 381/104 |
| 2005/0060759 | A1 | 3/2005 | Rowe et al. | |
| 2005/0190927 | A1 * | 9/2005 | Petroff | 381/59 |
| 2006/0056386 | A1 * | 3/2006 | Stogel | 370/351 |
| 2006/0149632 | A1 | 7/2006 | Register et al. | |
| 2007/0047719 | A1 | 3/2007 | Dhawan et al. | |
| 2007/0078708 | A1 | 4/2007 | Yu et al. | |
| 2007/0078709 | A1 | 4/2007 | Rajaram | |
| 2007/0220054 | A1 | 9/2007 | Hunter et al. | |

FOREIGN PATENT DOCUMENTS

| | | |
|---|---|---|
| JP | 09233591 | 9/1997 |
| JP | 2002247697 | 8/2002 |
| JP | 2002369281 | 12/2002 |
| JP | 2005191851 | 7/2005 |
| JP | 2008519575 | 5/2008 |
| WO | WO9636109 | 11/1996 |
| WO | WO9738488 | 10/1997 |
| WO | WO02076149 | 9/2002 |
| WO | WO2006050754 | 5/2006 |

OTHER PUBLICATIONS

Internatiol Search Report dated Feb. 19, 2009.

Gerzon, M.A., "Ambisonics in Multichannel Broadcasting and Video", Journal of the Audio Engineering Society, Audio Engineering Society, New York, NY, US, vol. 33, No. 11, Nov. 1, 1985, pp. 859-871, XP0007946181SSN: 1549-4950.

* cited by examiner

NETWORK AUDIO PROCESSOR

CROSS-REFERENCE TO RELATED APPLICATIONS

This application claims the benefit, under 35 U.S.C. §365 of International Application PCT/US2008/008,735, filed 17 Jul. 2008, which was published in accordance with PCT Article 21(2) on 26 Feb. 2009, in English and which claims the benefit of United States Provisional Patent Application No. 60/964,978 filed 16 Aug. 2007.

FIELD OF THE INVENTION

The present invention generally relates to the audio processing and, more particularly, to a method and apparatus for the control of audio levels in a networked audio environment.

BACKGROUND OF THE INVENTION

In the field of speaker system design and implementation, many factors play a decisive role in determining, for example, what types of speakers to use, how large the speakers should be, what frequency response the speakers should have, and so on. One of the more important off these factors is the environment in which the speakers must operate. Specifically, the frequencies and amplitudes of the ambient noise surrounding the speakers-operational area must be considered.

Conventional speakers of today are utilized, for example, to present audio or audio/video advertisements in commercial and retail store environments where ambient noise levels can vary widely over time. It is known in the audio field that the intelligibility of reproduced speech or music sound in such environments, derived from an audio content signal, is strongly affected by the ratio of the volume of the reproduced sound to the volume of ambient noise. Intelligibility can therefore be enhanced by processing the audio content signal in such a manner as to vary the volume of the reproduced sound directly as a function of the volume of the ambient noise. Further, it is known in the audiology field that the intelligibility of a hearing aid microphone output signal containing both live speech and ambient noise signal components can be enhanced through a signal process that introduces both compressed gain and increasing high frequency feedback in response to decreasing amplitude of such speech and noise signal.

Such conventional speaker systems provide amplitude compensation linearly and directly as a function of the changing ambient noise. This linear compensation is a transfer function. However, the linear transfer function is non-optimal for at least retail store and other commercial environments, which commonly exhibit frequent and widely varying changes in ambient noise, since the conventionally compensated speaker output signal provides commensurately frequent and widely varying changes in sound levels that can be annoying to listeners. As such, speaker systems have been introduced providing direct, but incremental, amplitude compensation as a function of such frequent and widely varying changes in ambient noise. However, even such intelligent systems today are incapable of providing equalization among a network of speakers in, for example, a retail advertising environment and are incapable of detecting when at least one speaker of a network of speakers are inoperable, which can ultimately negatively effect equalization calculations.

As such, what is needed is a speaker system providing direct, but incremental, amplitude compensation that is capable of equalization of a plurality of speakers in a network and that is capable of sensing inoperability of speakers.

SUMMARY OF THE INVENTION

Embodiments of the present invention address the deficiencies of the prior art by providing a method and apparatus for the control of audio levels in an audio environment.

The various embodiments of the present invention provide the ability to deliver synchronized audio, to receive and backhaul audio watermarks and to respond to an acoustic environment.

In one embodiment of the present invention, a network audio processing circuit includes a first means for receiving a reproduced audio content signal, a microphone for providing a microphone output signal in accordance with ambient noise, a second means for enabling the microphone output signal during first increments of time when the reproduced audio content signal is substantially off, and disabling the microphone output signal during second increments of time when the reproduced audio content signal is on, and a signal processor, in communication with the first and second means. In one embodiment of the present invention, the signal processor applies a transfer function to the reproduced audio content signal, the transfer function incrementally increasing gain adjustments to the reproduced audio content signal as a function of an increasing amplitude of the microphone output signal, and incrementally decreasing gain adjustments to the reproduced audio content signal as a function of a decreasing amplitude of the microphone output signal, and applies an equalization curve to the audio content signal to boost frequencies in a vocal range that enhance consonant perception thus increasing speech intelligibility.

In an alternate embodiment of the present invention, a method of enhanced intelligibility of a reproduced audio content signal in the presence of ambient noise includes receiving the reproduced audio content signal, monitoring ambient noise signals using a microphone to provide a microphone output signal, enabling the microphone output signal during first increments of time when the reproduced audio content signal is substantially off, and disabling the microphone output signal during second increments of time when the reproduced audio content signal is on, such that the microphone output signal includes ambient noise signal components without including reproduced content signal components, applying a first transfer function to the reproduced audio content signal, the first transfer function incrementally increasing gain adjustments to the reproduced audio content signal as a function of an increasing amplitude of the microphone output signal, and incrementally decreasing gain adjustments to the reproduced audio content signal as a function of a decreasing amplitude of the microphone output signal, and applying an equalization curve to the audio content signal to boost frequencies in a vocal range that enhance consonant perception thus increasing speech intelligibility.

BRIEF DESCRIPTION OF THE DRAWINGS

The teachings of the present invention can be readily understood by considering the following detailed description in conjunction with the accompanying drawings, in which.

Figure 1:
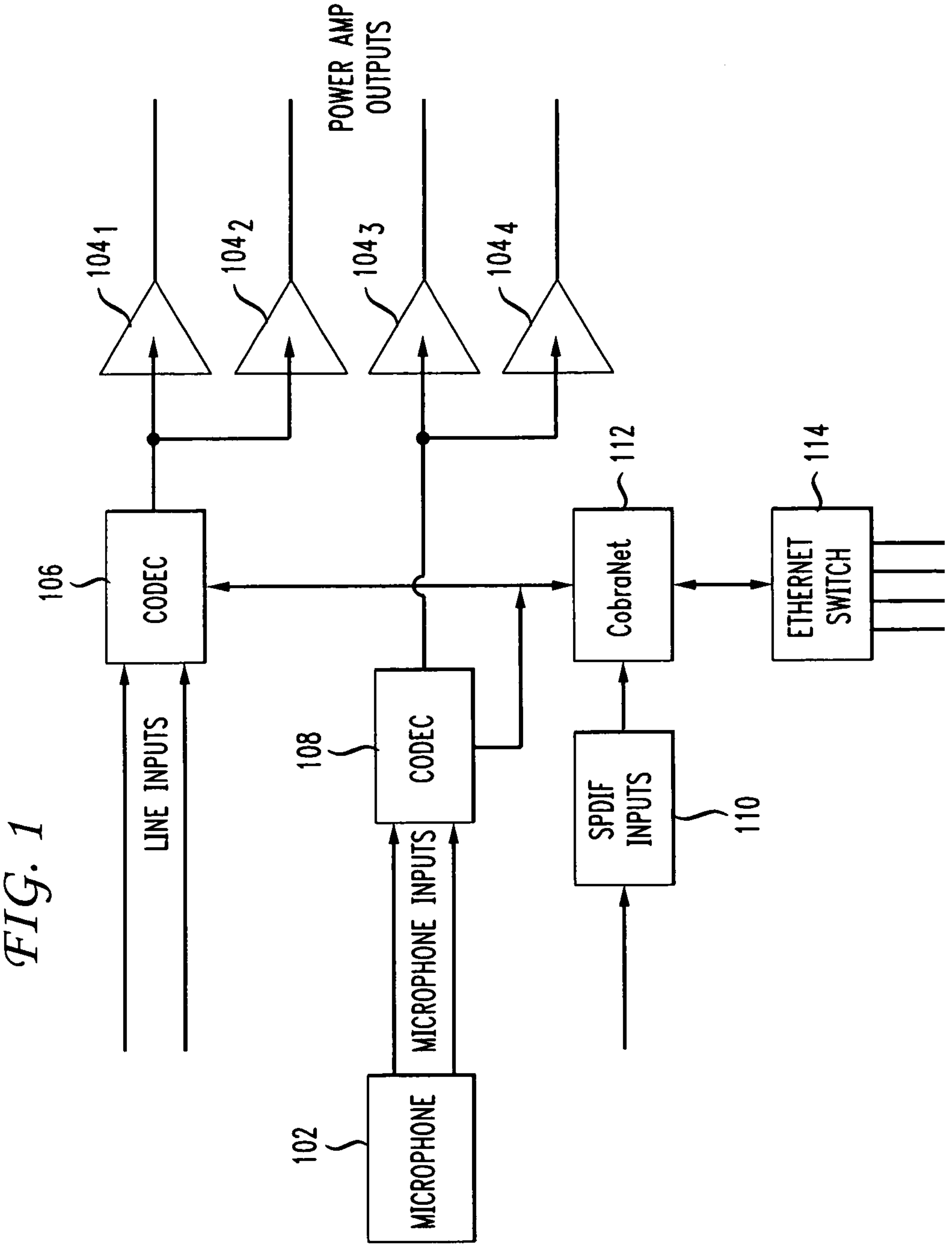
FIG. 1 depicts a high level block diagram of a network audio processing circuit in accordance with on embodiment of the present invention.

It should be understood that the drawings are for purposes of illustrating the concepts of the invention and are not necessarily the only possible configuration for illustrating the invention. To facilitate understanding, identical reference numerals have been used, where possible, to designate identical elements that are common to the figures.

DETAILED DESCRIPTION OF THE INVENTION

The present invention advantageously provides a method and apparatus for the control of audio levels in a network environment. Although the present invention will be described primarily within the context of a retail advertising network environment, the specific embodiments of the present invention should not be treated as limiting the scope of the invention. It will be appreciated by those skilled in the art and informed by the teachings of the present invention that the concepts of the present invention can be advantageously applied in substantially any audio environment for the control of audio levels.

In a commonly-owned, published Patent Application No. 20050190927, entitled "Speaker systems and methods having amplitude and frequency response compensation", which is herein incorporated by reference in its entirety, a speaker system and method are taught, in which the intelligibility of reproduced speech or music sound, derived from an audio content signal, is enhanced by means of at least one of a first and second transfer function of a signal process applied to the audio content signal. In the above identified published Patent Application, a method and system for providing enhanced intelligibility of a reproduced audio content signal in the presence of ambient noise are described such that the volume of the reproduced sound does not change too frequently as a consequence of rapidly occurring large changes in the ambient noise. In one embodiment, a signal process and transfer function were described for enhancing the intelligibility of the reproduced program signal in the presence of widely varying ambient noise levels over discrete time increments. The taught transfer function incrementally varied the volume of the reproduced sound, for example in steps of about 1 dB to about 10 dB, directly as a function of the volume of ambient noise, whereby such incremental variations ensure that the volume of the reproduced sound does not change too frequently as a consequence of rapidly occurring changes in the ambient noise. In the above-identified published Patent Application, the ambient noise was measured by a microphone or other similar sound input device, and was located on or near the speaker system. The system provided and utilized ambient noise signal components without reproduced program signal components by enabling the microphone signal while the program signal is substantially off, which might occur, for example, between audio or audio/video advertisements segments or between conversation or music segments.

According to at least one embodiment of the above-identified published Patent Application, a program input signal is applied to signal input of signal a process output port and provides a signal process output signal. The signal process introduces a transfer function providing incrementally increasing gain, for example, in steps of about 1 dB to about 10 dB as a function of increasing amplitude of a signal process control signal, and vice versa. The signal process of the above-identified published Patent Application is maintained between such times as the microphone output signal is enabled (that is, switched through to the control input of the signal process) to provide continuing sound reproduction using previously determined ambient noise level or average of levels.

Embodiments of the present invention provide a similar speaker system and method in which the intelligibility of reproduced speech or music sound, derived from an audio content signal, is enhanced by means of at least one of a first and second transfer function of a signal process applied to the audio content signal including providing ambient noise signal components without reproduced program signal components by enabling the microphone signal while the program signal is substantially off including various improvements described herein and in accordance with various embodiment of the present invention. More specifically, FIG. 1 depicts a high level block diagram of a network audio processing (NAP) circuit 100 in accordance with on embodiment of the present invention. The NAP circuit 100 of FIG. 1 illustratively comprises a microphone 102, at least one output power amplifier 104 (illustratively four output power amplifiers $\mathbf{104}_1$-$\mathbf{104}_4$), a first coder/decoder (CODEC) 106 and a second coder/decoder (CODEC) 108, a digital interface 110, a network-capable audio processor 112 (illustratively an Ethernet audio processor), and a network switch 114 (illustratively an Ethernet switch). In the embodiment of the present invention illustrated in FIG. 1, the first CODEC 106 receives input audio via, for example, two line inputs. The second CODEC 108 receives information from the microphone 102. The second CODEC 108 is operable for enabling the microphone output signal during first increments of time when the received (reproduced) audio content signal is substantially off, and disabling the microphone output signal during second increments of time when reproducing audio signals. The CODECs 106, 108 are analog-to-digital (ND) and digital-to-analog (D/A) converters for translating signals received to digital, and back again.

Figure 2:
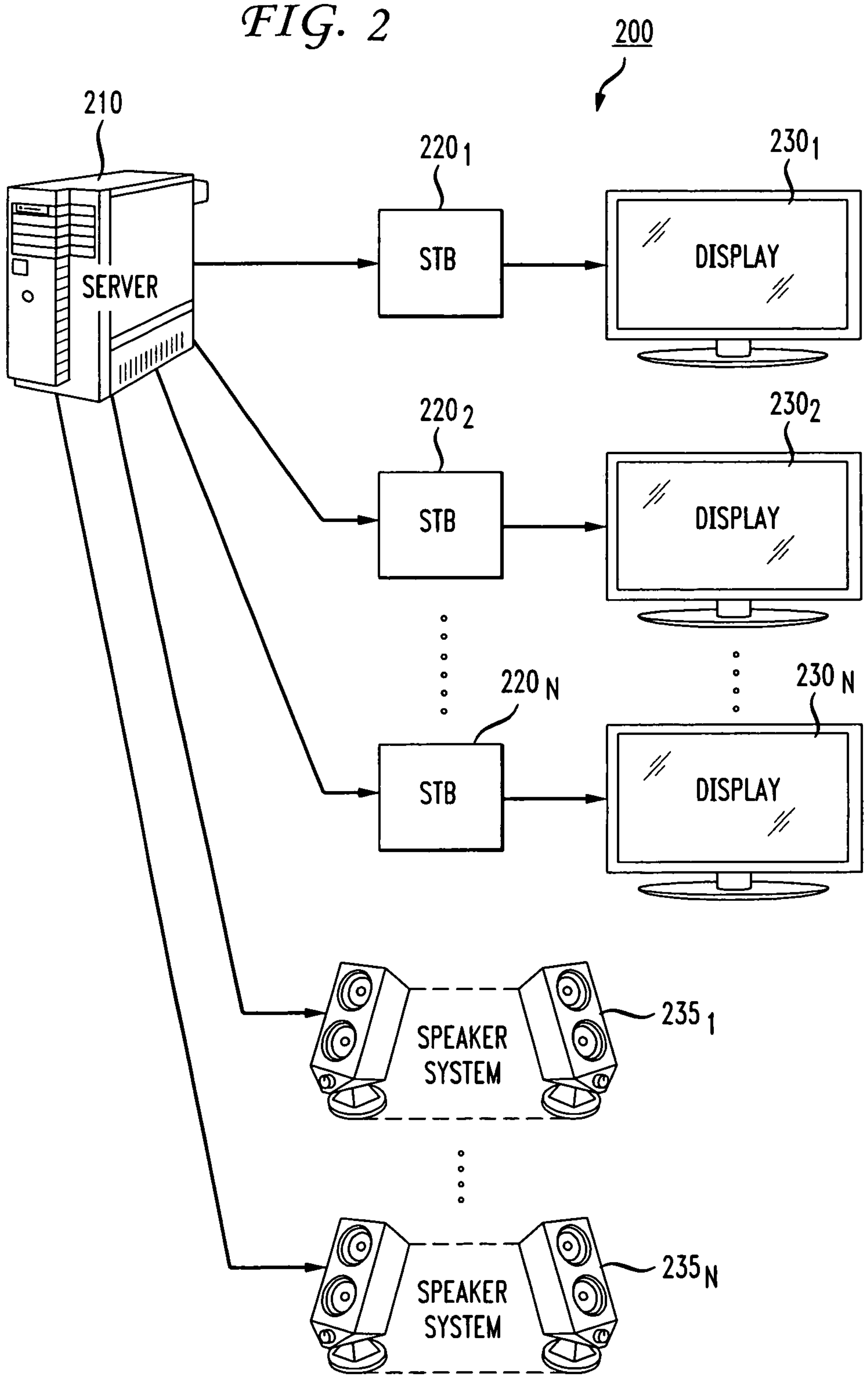
FIG. 2 depicts a high level block diagram of a content distribution system in which an embodiment of the present invention can be applied.

The digital interface 110, which in one embodiment can include an SPDIF (Sony/Phillips digital interface) transfers input digital information with minimal loss. The output of the digital interface 110 is communicated to the Ethernet audio processor 112, which in one embodiment can include a CobraNet™ and includes a combination of software, hardware and network protocol which allows distribution of many channels of real-time, high quality digital audio over a network. The digital interface 110 communicates with the first and second CODECs 106, 108 and with the Ethernet switch 114. The Ethernet audio processor 112 is in communication with the CODECs 106, 108 and applies a transfer function to the reproduced audio content signal for incrementally increasing gain adjustments to the reproduced audio content signal as a function of an increasing amplitude of the microphone output signal, and incrementally decreasing gain adjustments to the reproduced audio content signal as a function of a decreasing amplitude of the microphone output signal. That is, in response to a control signal from the Ethernet audio processor 112, the power amplifiers 104 are controlled to adjust the output volume level of the NAP circuit 100 as described above. The output of the power amplifiers 104 can then be communicated to an input of a speaker. In one embodiment of the present invention, the NAP circuit 100 is integrated into the speaker systems 235 of FIG. 2, presented and described below.

Although in the NAP circuit 100 of FIG. 1 specific components are illustrated for performing the specific functions of those components, other components having similar functions can replace those illustrated in the NAP circuit 100 of FIG. 1 and still be within the teachings of the present invention.

In an embodiment of a NAP circuit of the present invention, such as the NAP circuit 100 of FIG. 1, audio is received by the first CODEC 106. In the Ethernet audio processor 112 of the NAP 100, an equalization curve is applied to the audio to, for example, boost specific frequencies in the vocal range that enhance consonant perception thus increasing speech intelligibility in a high ambient noise environment. Additionally, a high pass filter (not shown) is applied to remove low frequencies as these frequencies are not necessary for speech intelligibility and only add to ambient noise. This has the added benefit of creating a tighter speaker coverage area improving targeting and reducing store associate fatigue. The equalization can be controlled in real time over the network allowing different EQ curves to be applied at different times of the day or in response to incoming measurements of the ambient noise via the NAPs microphone inputs. In addition, the equalization can be controlled over the network such that respective EQ curves can be applied to the various speakers and speaker systems of an audio environment such that speaker audio levels can be kept respectively consistent throughout, for example, a retail environment. The application of equalization curves to audio in other applications is well known and as such will not be described in detail herein for the novel application of such equalization curves in a NAP circuit as described herein.

In addition, in various embodiments of a NAP circuit of the present invention, such as the NAP circuit 100 of FIG. 1, respective Ethernet audio processors 112 of the NAPs 100 of speakers or speaker systems of the present invention can apply different amounts of delay to a respective audio signal. For example, in one embodiment of a NAP circuit of the present invention, a delay is added on each of the 4 output channels of the amplifier of the NAP circuit. This allows for the creation of a timed arrival sound field. This technique can be used to make it appear that audio is emanating from a respective display when in fact most of the audio is coming from another direction, such as an overhead speaker system.

Even further, in various embodiments of a NAP circuit of the present invention, such as the NAP circuit 100 of FIG. 1, the Ethernet audio processor 112 of the NAP 100 is able to query the amplifier section 104 of the NAP to determine whether or not a speaker is connected. For example, in one embodiment of the present invention, a network server is able to communicate with the Ethernet audio processor 112 to determine if a speaker is connected to the NAP 100 or if a connected speaker is operational. Such functionality enables speaker compliance to be checked both at installation and during regular operation. It also provides verification that the audio portion of the content was able to be played back on a connected speaker.

The NAP circuit 100 of the present invention is preferably small enough in form factor to be integrated into a respective speaker. For example, in one embodiment of the present invention, the NAP circuit 100 does not exceed the size of 6.3 in×6.7 in×1.7 in. In addition, the NAP circuit 100 should use as low of a current draw as practicable. For example, in one embodiment of the present invention the power draw of the NAP circuit 100 does not exceed 3 amps at 120VAC.

In an embodiment of the present invention, the NAP circuit 100 can include two Line Level Inputs using female RCA connectors and a two Channel Amplified Output using a terminal strip rated at 20 Watts into 8 Ohms. In addition, the NAP circuit 100 can include a 100 Mbps Full Duplex Ethernet Port using female RJ-45 connector with LED link status indicator. The NAP circuit 100 can provide a standard RJ-45 Ethernet connector with a LED to indicate link status. The interface can support 100 Mb/sec.

In an alternate embodiment of the present invention, the NAP circuit 100 can include a button that can be used in different ways to reset, self-test, or ID the NAP circuit 100 on the network. For example, if the button is pushed once while the unit is on, the NAP circuit 100 will ID itself on the network, if the button is held down for 3 seconds it resets the NAP circuit 100, and if the button is held down while applying power the NAP circuit 100 enters a self-test mode. Self-test can include audio output test tones which can be picked up by the microphone of the NAP circuit 100.

FIG. 2 depicts a high level block diagram of a content distribution system in which an embodiment of a NAP circuit of the present invention can be applied. The content distribution system 200 of FIG. 2 illustratively comprises at least one server 210, a plurality of receiving devices such as tuning/decoding means (illustratively set-top boxes (STBs)) $\mathbf{220}_1$-$\mathbf{220}_n$, and a respective display $\mathbf{230}_1$-$\mathbf{230}_n$ for each of the set-top boxes $\mathbf{220}_1$-$\mathbf{120}_n$, and other receiving devices, such as audio output devices (illustratively speaker systems) $\mathbf{235}_1$-$\mathbf{235}_n$. A NAP circuit of the present invention, such as the NAP circuit 100 of FIG. 1, can be integrated into the audio output device, such as the speaker systems 235 of FIG. 2.

Although in the system 200 of FIG. 2, each of the plurality of set-top boxes $\mathbf{220}_1$-$\mathbf{220}_n$, is illustratively connected to a single, respective display, in alternate embodiments of the present invention, each of the plurality of set-top boxes $\mathbf{220}_1$-$\mathbf{220}_n$, can be connected to more than a single display. In addition, although in the content distribution system 200 of FIG. 2 the tuning/decoding means are illustratively depicted as set-top boxes 220, in alternate embodiments of the present invention, the tuning/decoding means of the present invention can comprise alternate tuning/decoding means such as a tuning/decoding circuit integrated into the displays 230 or other stand alone tuning/decoding devices and the like. Even further, receiving devices of the present invention can include any devices capable of receiving content such as audio, video and/or audio/video content.

Figure 3:
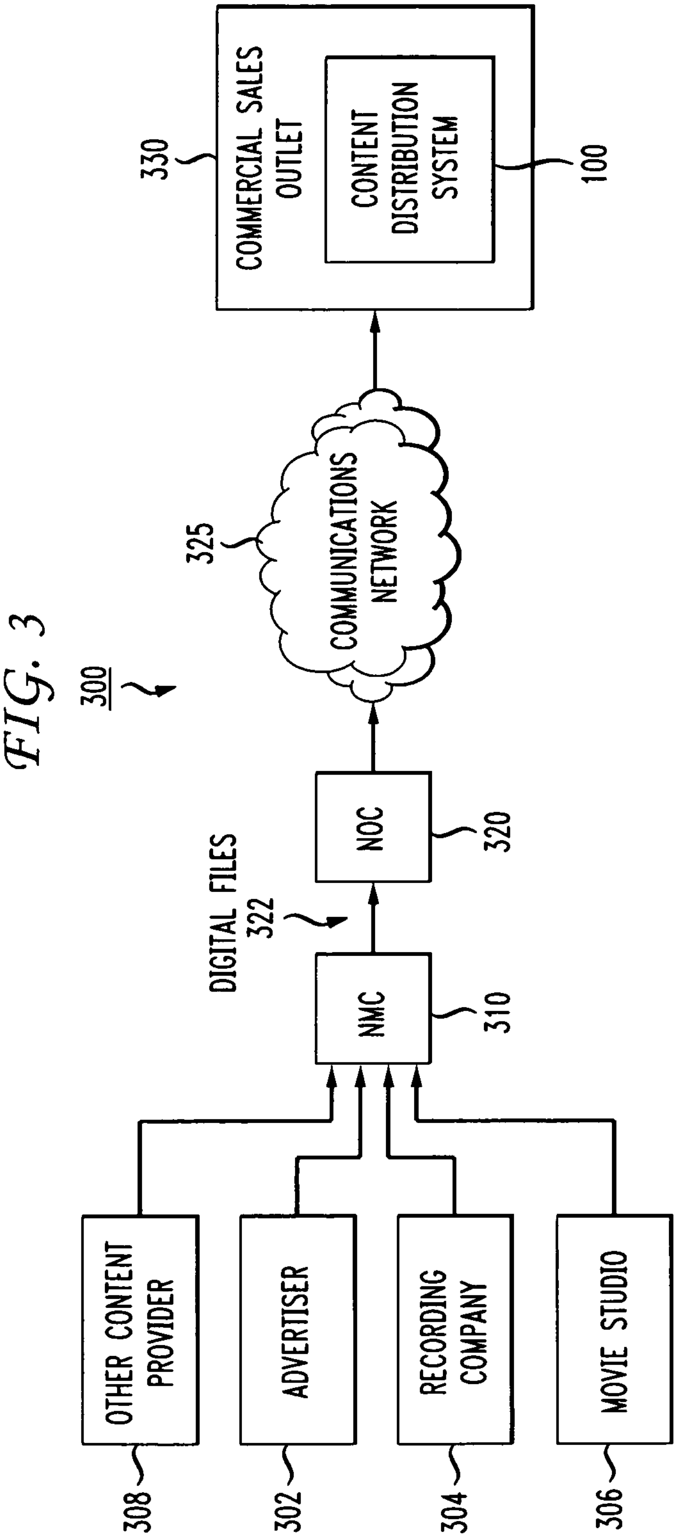
FIG. 3 depicts a high level block diagram of an in-store advertising network in which an embodiment of the present invention can be applied in accordance with on embodiment of the present invention.

In one embodiment of the present invention, the content distribution system 200 of FIG. 2 can be a part of an in-store advertising network. For example, FIG. 3 depicts a high level block diagram of an in-store advertising network 300 for providing in-store advertising. In the advertising network 300 of FIG. 3, the advertising network 300 and distribution system 200 employ a combination of software and hardware that provides cataloging, distribution, presentation, and usage tracking of music recordings, home video, product demonstrations, advertising content, and other such content, along with entertainment content, news, and similar consumer informational content in an in-store setting. The content can include content presented in compressed or uncompressed video and audio stream format (e.g., MPEG4/MPEG4 Part 10/AVC-H.264, VC-1, Windows Media, etc.), although the present system should not be limited to using only those formats.

In one embodiment of the present invention, software for controlling the various elements of the in-store advertising network 300 and the content distribution system 200 can include a 32-bit operating system using a windowing environment (e.g., MS-Windows™ or X-Windows operating system) and high-performance computing hardware. The advertising network 300 can utilize a distributed architecture and provides centralized content management and distribution control via, in one embodiment, satellite (or other method, e.g., a wide-area network (WAN), the Internet, a series of microwave links, or a similar mechanism) and in-store modules.

As depicted in FIG. 3, the content for the in-store advertising network 300 and the content distribution system 200 can be provided from an advertiser 302, a recording company 304, a movie studio 306 or other content providers 308. An advertiser 302 can be a product manufacturer, a service provider, an advertising company representing a manufacturer or service provider, or other entity. Advertising content from the advertiser 302 can consist of audiovisual content including commercials, "info-mercials", product information and product demonstrations, and the like.

A recording company 304 can be a record label, music publisher, licensing/publishing entity (e.g., BMI or ASCAP), individual artist, or other such source of music-related content. The recording company 304 provides audiovisual content such as music clips (short segments of recorded music), music video clips, and the like. The movie studio 306 can be a movie studio, a film production company, a publicist, or other source related to the film industry. The movie studio 306 can provide movie clips, pre-recorded interviews with actors and actresses, movie reviews, "behind-the-scenes" presentations, and similar content.

The other content provider 308 can be any other provider of video, audio or audiovisual content that can be distributed and displayed via, for example, the content distribution system 200 of FIG. 2.

In one embodiment of the present invention, content is procured via the network management center 310 (NMC) using, for example, traditional recorded media (tapes, CD's, videos, and the like). Content provided to the NMC 310 is compiled into a form suitable for distribution to, for example, the local distribution system 200, which distributes and displays the content at a local site.

The NMC 310 can digitize the received content and provide it to a Network Operations Center (NOC) 320 in the form of digitized data files 322. It will be noted that data files 322, although referred to in terms of digitized content, can also be streaming audio, streaming video, or other such information. The content compiled and received by the NMC 310 can include commercials, bumpers, graphics, audio and the like. All files are preferably named so that they are uniquely identifiable. More specifically, the NMC 310 creates distribution packs that are targeted to specific sites, such as store locations, and delivered to one or more stores on a scheduled or on-demand basis. The distribution packs, if used, contain content that is intended to either replace or enhance existing content already present on-site (unless the site's system is being initialized for the first time, in which case the packages delivered will form the basis of the site's initial content). Alternatively, the files may be compressed and transferred separately, or a streaming compression program of some type employed.

The NOC 320 communicates digitized data files 322 to, in this example, the content distribution system 200 at a commercial sales outlet 230 via a communications network 225. The communications network 225 can be implemented in any one of several technologies. For example, in one embodiment of the present invention, a satellite link can be used to distribute digitized data files 222 to the content distribution system 100 of the commercial sales outlet 230. This enables content to easily be distributed by broadcasting (or multicasting) the content to various locations. Alternatively, the Internet can be used to both distribute audiovisual content to and allow feedback from commercial sales outlet 230. Other ways of implementing communications network 225, such as using leased lines, a microwave network, or other such mechanisms can also be used in accordance with alternate embodiments of the present invention.

The server 110 of the content distribution system 100 is capable of receiving content (e.g., distribution packs) and, accordingly, distribute them in-store to the various receivers such as the set-top boxes 120 and displays 130 and the speaker systems 135. An embodiment of a NAP circuit of the present invention, such as the NAP circuit 100 of FIG. 1, can then receive the communicated content and perform the various inventive aspects of the a NAP circuit of the various embodiments of the present invention described herein.

Having described various embodiments for a method and apparatus for the control of audio levels in an audio environment (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention. While the forgoing is directed to various embodiments of the present invention, other and further embodiments of the invention may be devised without departing from the basic scope thereof.

The invention claimed is:

1. A network audio processing circuit, comprising:

a means for receiving a reproduced audio content signal;

a microphone for providing a microphone output signal in accordance with ambient noise;

a means for enabling the microphone output signal during first increments of time when the reproduced audio content signal is substantially off, and disabling the microphone output signal during second increments of time when the reproduced audio content signal is on;

a signal processor, in communication with the means for receiving a reproduced audio content signal and the means for enabling and disabling the microphone output signal for:

applying a transfer function to the reproduced audio content signal, the transfer function incrementally increasing gain adjustments to the reproduced audio content signal as a function of an increasing amplitude of the microphone output signal, and incrementally decreasing gain adjustments to the reproduced audio content signal as a function of a decreasing amplitude of the microphone output signal; and applying an equalization curve to the audio content signal to boost frequencies in a vocal range that enhance consonant perception thus increasing speech intelligibility;

a means for enabling the network audio processing circuit to identify itself on the network; and at least one amplifier having an input coupled to an output signal of the signal processor and an output coupled to an input of a speaker, wherein the signal processor communicates with the at least one amplifier to determine whether or not a respective speaker is connected to the audio processing circuit and if a connected speaker is operational.

2. The network audio processing circuit of claim 1, wherein said signal processor further applies a delay to the audio content signal.

3. The network audio processing circuit of claim 2, wherein said delayed audio content signal is perceived to be emanating from a content playout device associated with said audio content signal instead of from a speaker on which said audio processing circuit is integrated.

4. The network audio processing circuit of claim 1, wherein the means for enabling the network audio processing circuit to identify itself on the network is further configured to enable a reset of the network audio processing circuit.

5. The network audio processing circuit of claim 1, wherein the means for enabling the network audio processing circuit to identify itself on the network is further configured to enable a self test of the network audio processing circuit.

6. A method of enhanced intelligibility of a reproduced audio content signal in the presence of ambient noise, comprising the steps of:

receiving the reproduced audio content signal;

monitoring ambient noise signals using a microphone to provide a microphone output signal;

enabling the microphone output signal during first increments of time when the reproduced audio content signal is substantially off, and disabling the microphone output signal during second increments of time when the reproduced audio content signal is on, such that the microphone output signal includes ambient noise signal components without including reproduced content signal components;

applying a first transfer function to the reproduced audio content signal, the first transfer function incrementally increasing gain adjustments to the reproduced audio content signal as a function of an increasing amplitude of the microphone output signal, and incrementally decreasing gain adjustments to the reproduced audio content signal as a function of a decreasing amplitude of the microphone output signal;

applying an equalization curve to the audio content signal to boost frequencies in a vocal range that enhance consonant perception thus increasing speech intelligibility;

initiating a query via a processor connected to an input of an amplifier whose output is connected to a speaker to determine whether or not a respective speaker is connected and if a connected speaker is operational; and enabling the network audio processing circuit to identify itself on the network.

7. The method of claim 6, wherein the incremental gain adjustments are in steps of between about 1 dB and about 10 dB.

8. The method of claim 6, comprising applying a delay to the audio content signal.

9. The method of claim 6, wherein said enabling the network audio processing circuit to identify itself on the network further comprises enabling the conducting of a self test of the network audio processing circuit.

10. The method of claim 6, wherein said enabling the network audio processing circuit to identify itself on the network further comprises enabling a reset of the network audio processing circuit.

* * * * *